United States Patent [19]

Neidorff

[11] Patent Number: 4,849,656
[45] Date of Patent: Jul. 18, 1989

[54] POWER-ON DETECTION CIRCUIT

[75] Inventor: Robert A. Neidorff, Bedford, N.H.

[73] Assignee: Unitrode Corp., Lexington, Mass.

[21] Appl. No.: 61,794

[22] Filed: Jun. 11, 1987

[51] Int. Cl.[4] .................... H03K 5/153; H03K 17/14; H03K 17/16; H03K 17/60
[52] U.S. Cl. ................................. 307/360; 307/299.3; 307/591; 307/296.3; 340/663; 361/56; 323/315
[58] Field of Search ............... 307/299.3, 296 R, 591, 307/592, 593, 603, 360, 362; 340/636, 663; 361/92, 56; 323/285, 316, 315; 330/261, 257

[56] References Cited

U.S. PATENT DOCUMENTS

| | | | |
|---|---|---|---|
| 4,184,087 | 1/1980 | Nutz | 307/299.3 X |
| 4,408,132 | 10/1983 | Kuwahara | 307/299.3 X |
| 4,525,638 | 6/1985 | Gray | 307/299.3 X |
| 4,717,839 | 1/1988 | Miller | 307/299.3 X |

OTHER PUBLICATIONS

Lefferts, "A New Interfacing Concept; the Monolithic Temperature Transducer", National Semiconductor, AN-132, p. 7, 1975.

Primary Examiner—Stanley D. Miller
Assistant Examiner—David R. Bertelson
Attorney, Agent, or Firm—Weingarten, Schurgin, Gagnebin & Hayes

[57] ABSTRACT

A threshold comparator having hysteresis wherein the repeatable threshold levels are established by multiple current paths and resistance ratios, which provides an under-voltage lock-out signal. The current paths are established by transistors fabricated on a common substrate and include a split collector P-N-P transistor that provides the distribution of the input signal to the various current paths. The turn-on and turn-off threshold points of the circuit according to the present invention are established by resistance ratios which are more easily maintained than are absolute resistance values. Similarly, when implemented on a common substrate, the remaining component values may be selected so that the thresholds values are nearly independent of temperature, providing an easily manufactured, high yield circuit.

9 Claims, 1 Drawing Sheet

POWER-ON DETECTION CIRCUIT

FIELD OF THE INVENTION

The present invention relates to power supply threshold detectors, and in particular power supply threshold detectors incorporated in integrated circuitry without Zener reference elements.

BACKGROUND OF THE INVENTION

The detection of adequate power supply voltage upon equipment power up requires an accurate and consistent determination of the earliest point of adequate power supply voltages, and minimization of false signals and changes the threshold at which a signal is produced indicating the proper supply potential. Previous power-on detection circuits which produce under-voltage lock-out signals for inadequate power supply voltage have almost universally relied upon comparison of an input voltage to a Zener diode reference element. However, the actual potential of the Zener diode reference is notoriously process and temperature dependent. As a result, the change in Zener potential due to manufacturing and temperature variances significantly affect product yield. Alternately, construction of discrete under-voltage lock-out circuits having selected Zener diodes is both time consuming and expensive.

SUMMARY OF THE INVENTION

The power-on detection circuit according to the present invention comprises a comparator having hysteresis, with an integral threshold circuit wherein the internal threshold is provided without a Zener reference element. The input signal to be measured is received by first transistor which in turn provides multiple current signals therefrom from a split collector. Each collector current is received by separate current sinking elements including additional transistors and resistors which produce an under-voltage lock-out signal in response to changes in the input voltage. Changes in input voltage cause corresponding changes in current in each of the various collector current paths. The threshold at which the under-voltage lock-out signal is produced is determined by resistance ratios in the various collector current paths and semiconductor band-gap voltage (Vbg) of the semiconductor material.

The circuit can be easily implemented on a bipolar monolithic integrated circuit, consumes very little supply current, and consumes very little circuit space. The preferred embodiment comprises 5 transistors and 3 resistors, and is independent of resistor absolute value.

BRIEF DESCRIPTION OF THE DRAWING

These and other features according to the present invention will be better understood by reading the following detailed description taken together with drawing wherein.

DETAILED DESCRIPTION OF THE INVENTION

Figure 1:
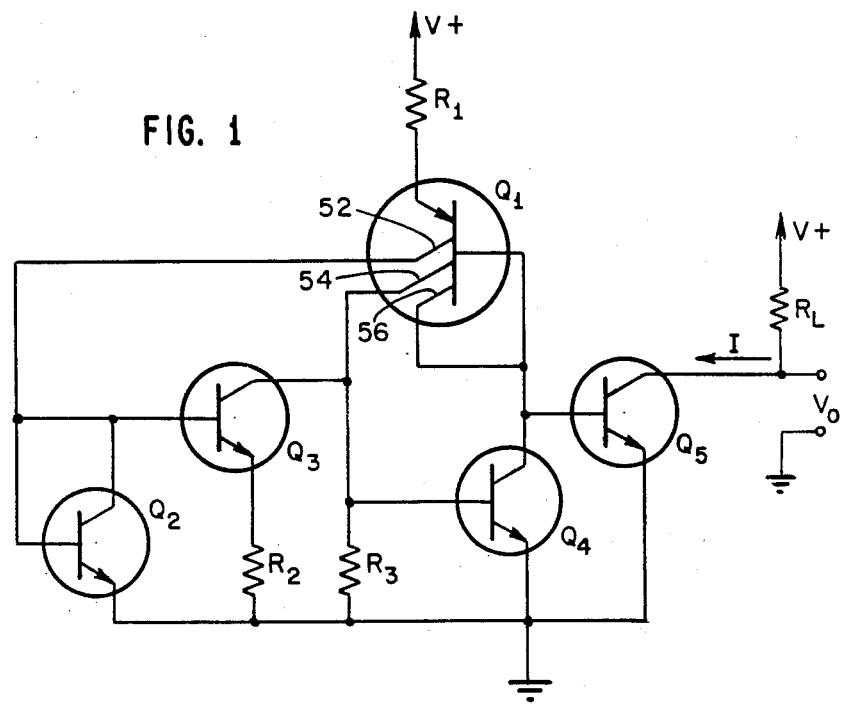
FIG. 1 is a schematic diagram of one embodiment of the present invention.

As shown in FIG. 1, the power supply voltage to be monitored is received by the emitter of transistor $Q_1$ through resistor $R_1$ at input V+. The transistors $Q_2$ and $Q_3$ along with $R_2$ and $R_3$ form a temperature compensating current sink. Transistor $Q_4$ acts an error amplifier, which amplifies slight differences between the currents from $Q_1$ collector 54 and the temperature compensating current from the collector of $Q_3$ and $R_3$. Transistors $Q_5$ is the output driver providing the current flow exemplified by FIG. 2.

For V+ less than Vbe, every transistor is off. For increasing monitored voltage above 2Vbe, current begins to flow through R1, the emitter-base junction of transistor $Q_1$ and through the emitter-base junction transistor $Q_5$, initially turning both $Q_1$ and $Q_5$ on. However, at the same time, a current equal to the base current of $Q_5$ flows into the base and collector of $Q_2$ and into the base of $Q_3$. Also, a current equal to the base current of $Q_5$ flows into $R_3$, the base of $Q_4$ and the collector of $Q_3$. For V+ below the turn-on threshold, the current in the collector of $Q_3$ plus the current in $R_3$ equals the current in the corresponding collector 54 of $Q_1$, providing no (or insufficient) base current to turn on transistor $Q_4$. However, as the monitored voltage V+ increases to the turn-on threshold, $Q_4$ will begin to turn on, causing an increasing current to flow through resistor $R_1$ and thus increasing current flow to the collectors of transistor $Q_1$. As $Q_4$ turns on, it pulls additional current from the base of $Q_1$, which provides more current from $Q_1$ (and therefore collector 54), which turns on $Q_4$ harder. Transistor $Q_4$ turning on instantly turns off transistor $Q_5$, which provides an output signal shown by graph 60 curve portions 62, 64, 66, depending on device temperature. Thus, the turn-on threshold of the present apparatus is determined in part by the current resulting from the selection of resistor $R_1$ relative to the single base emitter voltage (Vbe) of transistor $Q_1$. For any voltage above that thershold the circuit state remains the same and $Q_5$ stays off.

As the monitored power supply voltage at V+ begins to decrease, such as in a power down sequence, transistors $Q_1$ and $Q_4$ initially stay on, but the current out of any $Q_1$ collector (52, 54, 56) decreases). When the current out of collector (54) of $Q_1$ drops below the current sinking through the collector of transistor $Q_3$ plus the current Vbe/$R_3$, transistor $Q_4$ will lose sufficient base drive and turn off, turning $Q_5$ on, shown by curve section 74 on FIG. 2.

Figure 2:
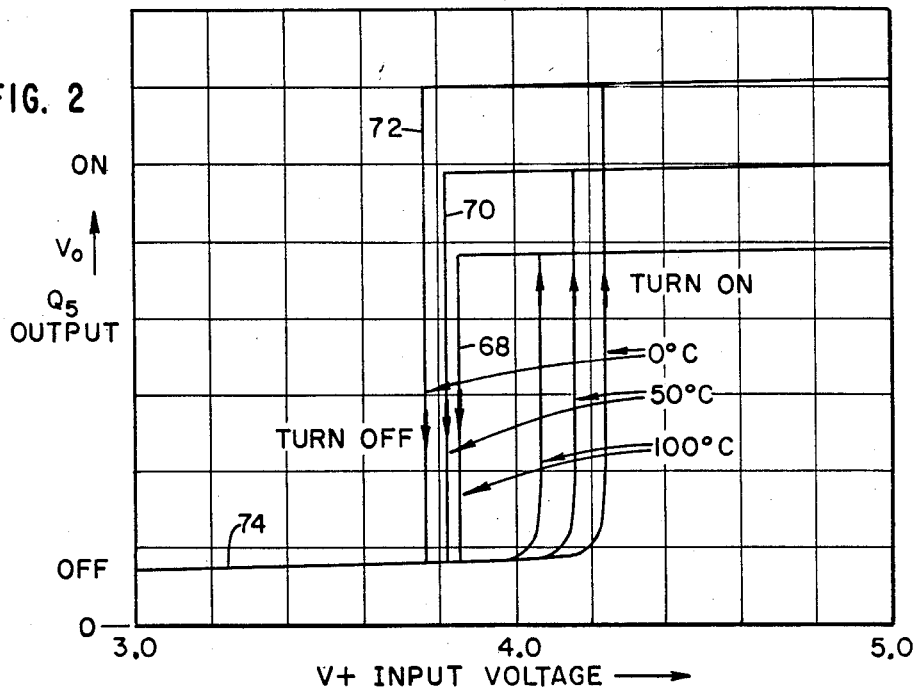
FIG. 2 is a graph of the characteristics of the circuits according to FIG. 1.

The separate turn-off threshold which provides the hysteresis characteristic shown in FIG. 2 of the circuit of 1 is due to the fact that transistor $Q_4$, no longer being saturated allows the Vbe of transistor $Q_5$ to be added to (in series with) the Vbe of transistor $Q_1$, thereby affecting the current produced from collectors 52, 54 and 56 of transistor $Q_1$ (in response to the selected resistor $R_1$ and the monitored voltage V+). An approximation of the turn-on and turn-off thresholds are enumerated below in equations 1 and 2 respectively, where Vbg is the band-gap potential of the semiconductor material, such as silicon in the present invention:

$$Vcc_1 = \left(2 + \frac{R_1}{R_3}\right)V_{bg} + \left[\frac{K}{q} \frac{R_1}{R_2} \ln M + .004 - .002 \frac{R_1}{R_3}\right]T \quad (1)$$

$$Vcc_2 = \left(2 + \frac{R_1}{R_3}\right)V_{bg} + \quad (2)$$

$$\left[ \frac{K}{q} \frac{R_1}{R_2} \ln M + .004 - .002 \frac{R_1}{R_3} \right] T$$

Note that for a particular choice of components, the turn-on and turn-off thresholds can be made nearly independent of temperature. For instance, in the embodiment shown, $R_1 = 30K$ ohms, $R_2 = 3K$ ohms, and $R_3 = 80k$ ohms to provide a voltage threshold of approximately 4.2 volts with $\pm 200$ millivolts (mv) of hysteresis, FIG. 2.

A graph showing the turn-on and turn-off points of the embodiment shown in FIG. 1 of the present invention shows the response of a circuit for 0° C., 50° C. and 100° C., wherein it can be appreciated that the hysteresis characteristics is repeatable in the manufacturing process and maintained under a wide temperature variation and the threshold points are sufficiently consistent to eliminate the necessity of Zener reference elements in circuitry embodying the present invention. Thus the apparatus according to the present invention provides a repeatable accuracy significantly exceeding that achievable with standard process Zener diodes, and is applicable to various devices such as linear and switching voltage regulators, and inductive load drivers and in complex control systems.

Modifications and substitutions of the present invention by one skilled in the art is considered to be within the scope of the present application, which is not to be limited except by the claims which follows.

What is claimed is:

1. A power-on detection circuit, comprising:
   means for providing a source of current at a first magnitude in response to a supply potential and a first transistor base-emitter voltage drop;
   means for receiving a selected portion of current from said means for providing a source of current; and
   means for sensing when the selected portion of current exceeds a selected magnitude, reducing said first transistor base-emitter drop voltage and providing an output signal indicating a selected supply potential corresponding to an on condition.

2. The power-on detection circuit of claim 1, wherein
   said means for providing comprises a transistor having a plurality of collectors,
   said means for receiving being connected to one of said plurality of collectors, and
   said means for sensing being connected to a second of said plurality of collectors.

3. A power-on detection circuit, comprising:
   means for providing a source of current at a first magnitude in response to a supply potential and a first transistor base-emitter voltage drop;
   temperature compensated means for receiving a selected portion of current from said means for providing a source of current; and
   means for sensing when the selected portion of current exceeds a selected magnitude, reducing said first transistor base-emitter drop voltage and providing an output signal indicating a selected supply potential corresponding to an on condition; wherein
   said temperature compensated means for providing a source of current comprises
      a multiple collector first transistor having a series connected emitter resistor,
      a diode connected second transistor connected to one of said multiple collectors and a common terminal, and
      a third transistor having a base junction connected to said second transistor, an emitter junction connected to said common terminal through an emitter resistor, a collector connected to a second collector of said first transistor and a resistor to said common terminal, and wherein
   said resistor connected to said first, second and third transistors are selected to provide the hysteresis turn-on and turn-off thresholds.

4. The power-on detection circuit of claim 3, wherein
   said means for sensing comprises a fourth transistor having a base junction connected to the collector of said third transistor, and wherein
   the current in excess of the current sunk by the collector of the third transistor and the resistor connected thereto is received by said fourth transistor to be made conductive.

5. The power-on detection circuit of claim 1, wherein at least one of said means for receiving and means for providing a source of current includes temperature compensation means.

6. A threshold detector for sensing a predetermined voltage level of a voltage source, comprising:
   means for providing a source of current at a first magnitude in response to a supply potential and a first transistor base-emitter voltage drop; and
   means for sensing when said source of current exceeds a selected magnitude, reducing said first transistor base-emitter voltage drop and providing on output signal indicating said voltage source has attained said predetermined voltage level.

7. The threshold detector of claim 6, further including
   current limiter means connecting said means for providing a source of current and said voltage source.

8. The threshold detector of claim 7, wherein
   said current limiter means comprises a resistor.

9. The threshold detector of claim 6, wherein
   said current limiter means comprises a resistor.

* * * * *